United States Patent
Doblar et al.

(10) Patent No.: US 8,018,738 B2
(45) Date of Patent: Sep. 13, 2011

(54) VOLTAGE REGULATOR ATTACH FOR HIGH CURRENT CHIP APPLICATIONS

(75) Inventors: Drew G. Doblar, San Jose, CA (US); Prabhansu Chakrabarti, Sunnyvale, CA (US); Michael J. Bushue, Belmont, CA (US)

(73) Assignee: Oracle America, Inc., Redwood City, CA (US)

( * ) Notice: Subject to any disclaimer, the term of this patent is extended or adjusted under 35 U.S.C. 154(b) by 764 days.

(21) Appl. No.: 12/131,410

(22) Filed: Jun. 2, 2008

(65) Prior Publication Data

US 2009/0296360 A1 Dec. 3, 2009

(51) Int. Cl.
 *H05K 1/11* (2006.01)
 *H05K 1/14* (2006.01)
(52) U.S. Cl. .......... 361/803; 361/760; 361/764; 439/66; 439/67; 439/637; 257/678; 257/685; 257/713; 174/260; 713/300
(58) Field of Classification Search .................. 361/715, 361/719–722, 760–767, 786, 803, 820, 792–795, 361/810–812, 780–784; 257/713–718, 676, 257/678, 685, 727–730, 758, 532, E29.001; 439/66, 67, 71, 74, 637, 620, 638, 485, 487, 439/924.1; 174/15.1, 16.3, 250–255, 262–266; 29/825, 830–832, 840, 854; 713/300, 310, 713/320, 330, 340
 See application file for complete search history.

(56) References Cited

U.S. PATENT DOCUMENTS

| | | | | |
|---|---|---|---|---|
| 4,954,878 A | * | 9/1990 | Fox et al. | 257/675 |
| 5,515,241 A | * | 5/1996 | Werther | 361/784 |
| 5,847,936 A | * | 12/1998 | Forehand et al. | 361/794 |
| 5,982,635 A | * | 11/1999 | Menzies et al. | 361/790 |
| 6,359,783 B1 | * | 3/2002 | Noble | 361/704 |
| 6,452,804 B1 | * | 9/2002 | Dibene et al. | 361/720 |
| 6,469,908 B2 | * | 10/2002 | Patel et al. | 361/760 |
| 6,556,455 B2 | * | 4/2003 | Dibene et al. | 361/785 |
| 6,584,685 B2 | * | 7/2003 | Chung et al. | 29/854 |
| 6,596,948 B1 | * | 7/2003 | Haden et al. | 174/262 |
| 6,611,435 B2 | * | 8/2003 | Kumar et al. | 361/807 |
| 6,643,916 B2 | * | 11/2003 | Larson | 29/610.1 |
| 6,709,277 B2 | * | 3/2004 | Ruttan et al. | 439/66 |
| 6,760,232 B2 | * | 7/2004 | Smith et al. | 361/780 |
| 6,791,846 B2 | | 9/2004 | Smith et al. | |
| 6,794,581 B2 | * | 9/2004 | Smith et al. | 174/260 |
| 6,801,431 B2 | * | 10/2004 | Hartke et al. | 361/704 |
| 6,847,529 B2 | * | 1/2005 | Dibene et al. | 361/803 |

(Continued)

*Primary Examiner* — Michail V Datskovskiy
(74) *Attorney, Agent, or Firm* — Meyertons, Hood, Kivlin, Kowert & Goetzel, P.C.; Erik A. Heter (57) ABSTRACT

A voltage regulator. The voltage regulator includes an interposer having, on a first side, a plurality of electrical connections suitable for coupling to a printed circuit board (PCB). The interposer also includes at least one power plane and at least one ground plane, wherein each of the power and ground planes is coupled to one or more of the electrical connections. The voltage regulator further includes a DC-DC converter that is electro-mechanically attachable to and detachable from the interposer. The interposer includes a socket, on a second side, that is suitable to receive two or more electromechanical connecting members of the DC-DC converter. When the DC-DC converter is attached to the interposer, at least one of the electromechanical connecting members is electrically coupled to a power plane of the interposer, while at least one other one of the electromechanical connecting members is electrically coupled to the ground plane.

20 Claims, 5 Drawing Sheets

U.S. PATENT DOCUMENTS

| | | | | |
|---|---|---|---|---|
| 6,947,293 | B2 * | 9/2005 | DiBene et al. | 361/803 |
| 6,979,891 | B2 * | 12/2005 | Wood et al. | 257/679 |
| 7,091,586 | B2 * | 8/2006 | Millik et al. | 257/685 |
| 7,095,619 | B2 * | 8/2006 | Panella et al. | 361/760 |
| 7,106,600 | B2 * | 9/2006 | Kupla et al. | 361/783 |
| 7,145,782 | B2 * | 12/2006 | Searls et al. | 361/780 |
| 7,209,366 | B2 * | 4/2007 | Prokofiev et al. | 361/803 |
| 7,222,243 | B2 * | 5/2007 | Kirker et al. | 713/300 |
| 7,235,880 | B2 * | 6/2007 | Prokofiev | 257/734 |
| 7,241,641 | B2 * | 7/2007 | Savastiouk et al. | 438/106 |
| 7,257,004 | B2 * | 8/2007 | Costello | 361/719 |
| 7,292,020 | B1 | 11/2007 | Smith et al. | |
| 7,298,628 | B2 * | 11/2007 | Panella et al. | 361/760 |
| 7,317,622 | B2 * | 1/2008 | Li | 361/782 |
| 7,342,805 | B2 * | 3/2008 | Larson | 361/780 |
| 7,396,948 | B2 * | 7/2008 | Howell et al. | 556/64 |
| 7,778,041 | B2 * | 8/2010 | Howell et al. | 361/803 |
| 7,881,072 | B2 * | 2/2011 | Dibene et al. | 361/803 |
| 7,886,431 | B2 * | 2/2011 | Weir et al. | 29/832 |
| 2002/0162039 | A1 * | 10/2002 | Kirker et al. | 713/330 |
| 2006/0014444 | A1 * | 1/2006 | Searls et al. | 439/894 |
| 2007/0279880 | A1 * | 12/2007 | Weir et al. | 361/794 |
| 2007/0279881 | A1 * | 12/2007 | Weir et al. | 361/794 |
| 2007/0279882 | A1 * | 12/2007 | Weir et al. | 361/794 |
| 2008/0157274 | A1 * | 7/2008 | Dattaguru et al. | 257/532 |
| 2008/0157343 | A1 * | 7/2008 | Dattaguru et al. | 257/703 |

* cited by examiner

VOLTAGE REGULATOR ATTACH FOR HIGH CURRENT CHIP APPLICATIONS

BACKGROUND OF THE INVENTION

1. Field of the Invention

This invention relates to electronic systems, and more particularly, power distribution in electronic systems.

2. Description of the Related Art

The increasing ability to provide integrate more circuits on an integrated circuit (IC) die has resulted in much great processing power for devices such as microprocessors, digital signal processors, and other types of IC's. The greater processing power requires, in turn, higher pin counts and greater power requirements. Since there is a trend towards lower voltages, the increased processing power results in higher current requirements.

Many types of modern packaged integrated circuits, such as processors, ASIC's, multi-chip modules, and so forth, require large amounts of current into and out of their respective packages during operation. Current requirements of 200-300 amperes are not uncommon. These high current requirements can pose significant challenges in providing the required conductive paths for power and ground. More particularly, it is difficult to distribute these amounts of current laterally through power and ground planes in a traditional printed circuit board. A printed circuit board (PCB) capable of carrying such large amounts of current requires several thick, heavy layers of copper or other suitably conductive material. The use of these heavy conductive layers can cause difficulty in drilling holes through the PCB (e.g., for plated through holes). Complications in signal routing can also arise, and the thermal characteristics of such a PCB can also make soldering components more difficult.

SUMMARY OF THE INVENTION

A voltage regulator is disclosed. In one embodiment, the voltage regulator includes an interposer having, on a first side, a plurality of electrical connections suitable for coupling to a printed circuit board (PCB). The interposer also includes at least one power plane and at least one ground plane, wherein each of the power and ground planes is coupled to one or more of the electrical connections. The voltage regulator further includes a DC-DC converter that is electro-mechanically attachable to and detachable from the interposer. The interposer includes a socket, on a second side, that is suitable to receive two or more electromechanical connecting members of the DC-DC converter. When the DC-DC converter is attached to the interposer, at least one of the electro-mechanical connecting members is electrically coupled to a power plane of the interposer, while at least one other of the electromechanical connecting members is electrically coupled to the ground plane.

An electronic assembly is also disclosed. In one embodiment, the electronic assembly includes a PCB and an IC package mounted to a first footprint on a first side of the PCB. A voltage regulator is mounted to a second side of the PCB, and is configured to provide power to an IC in the IC package. The voltage regulator includes an interposer having a plurality of electrical connections mounted to a footprint on the second side of the PCB and opposite the IC package. The interposer also includes a power plane and a ground plane. The power plane is electrically coupled to at least one of the electrical connections, while the ground plane is coupled to at least one other of the plurality of electrical connections. The voltage regulator further includes a DC-DC converter that is electro-mechanically coupled to the interposer. The DC-DC converter is electro-mechanically attachable to and detachable from the interposer. The interposer includes a socket configured to receive two or more electromechanical connecting members from the DC-DC converter. One of the electromechanical connecting members is electrically coupled to the power plane, while another one of the electromechanical connecting members is coupled to the ground plane.

A method for assembling an electronic assembly according to the disclosure herein includes soldering an IC package to a first side of a PCB, and coupling a voltage regulator to a second side of the PCB. Coupling the voltage regulator includes soldering an interposer to the second side of the PCB in a location opposite of the IC package. Coupling the voltage regulator further includes coupling a DC-DC converter to the interposer, wherein the interposer includes a socket configured to receive two or more electromechanical connecting members of the DC-DC converter, and wherein the DC-DC converter is electro-mechanically attachable to and detachable from the interposer. The operations of soldering the IC package and soldering the interposer are each performed prior to said coupling the DC-DC converter.

Accordingly, the method and apparatus disclosed herein enables a high-current voltage regulator to be attached to a PCB in order to distribute power to an IC mounted on the opposite side of the PCB. The method and apparatus split the voltage regulator into two different units, the interposer and the DC-DC converter. The interposer has a small thermal mass, and is thus suitable for soldering to the PCB. The DC-DC has a significantly greater thermal mass (due to the high current requirements), and is thus not suitable for soldering to a PCB. Instead, the DC-DC converter is electro-mechanically attached to the interposer via a socket in a manner that does not include soldering subsequent to soldering the interposer to the PCB. The DC-DC converter may be coupled to the interposer by bolts, pin-and-socket connector, surface-to-surface mating pints (e.g., a compression mounted land grid array), a flexible PCB portion that could be built as part of the DC-DC converter PCB (a 'rigid-flex' solution), or a cable-to-board connection.

BRIEF DESCRIPTION OF THE DRAWINGS

Other aspects of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling with the spirit and scope of the present invention as defined by the appended claims.

DETAILED DESCRIPTION OF THE INVENTION

Figure 1:
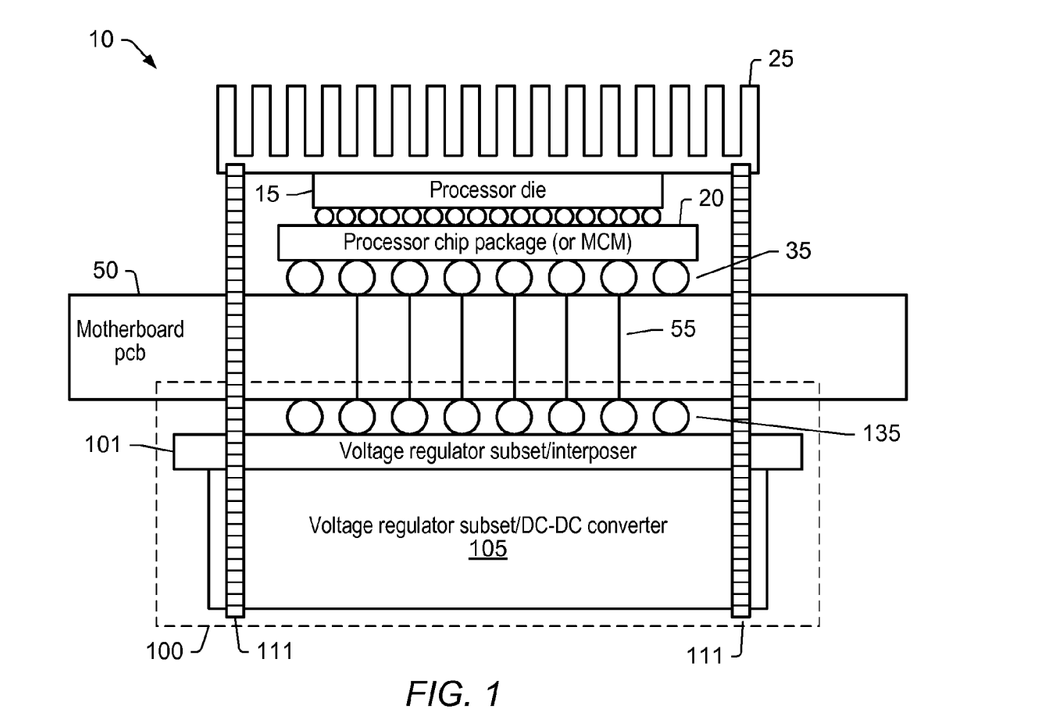
FIG. 1 is a drawing of one embodiment of an electronic assembly having a two-piece voltage regulator.

FIG. 1 is a drawing of one embodiment of an electronic assembly having a two-piece voltage regulator. In the embodiment shown, electronic assembly 10 includes a motherboard PCB (printed circuit board) 50 with a processor chip package 20 mounted to a first side and a voltage regulator 100 mounted to a second side. Processor chip package 20 includes a processor die 15 mounted thereon. It should be noted that embodiments having multiple chips coupled to processor chip package 20 are possible and contemplated, and as such, processor chip package 20 may be a multi-chip module (MCM). In this particular embodiment, a heat sink 25 is coupled to processor die 15 in order to disburse heat during operation.

Processor chip package 20 is coupled to motherboard 50 via a plurality of solder balls 35 arranged to form a ball-grid array (BGA). Embodiments utilizing pads forming a land-grid array (LGA) are also possible and contemplated (e.g., elastomeric connections, solder bumps, etc.). If the thickness of motherboard 50 permits, embodiments utilizing pins forming a pin-grid array (PGA), which corresponding plated-through holes are also possible and contemplated. Some of the solder balls are electrically connected to voltage regulator 100 through motherboard 50. Other solder balls (such as those on the periphery in this example) may be part of signal path upon which signals are conveyed to and/or from processor chip package 20 via motherboard 50. In some cases, solder balls that provide no electrical connection may also be present.

Voltage regulator 100 includes two primary components: an interposer 101 and a DC-DC converter 105. Because of their relative thermal masses, these two components are attached separately in electronic assembly 10. Interposer 101, in the embodiment shown, is coupled to motherboard 50 by a plurality of solder balls 135, which form a second BGA that may be directly opposite of the BGA formed by the BGA on the first side where processor chip package is attached. As noted above, elastomeric connections or other types of electrical connection used in conjunction with an LGA, or pins in a PGA may also be used. Generally speaking, any type of electrical connection suitable for coupling interposer 101 to a PCB such as motherboard 101 may be used where solder balls 135 are shown in FIG. 1.

A number of solder balls 135 are electrically connected to corresponding solder balls 35 by vertical vias 55. The vertical vias 55 in the embodiment shown provide a direct electrical path between the solder balls 35 and solder balls 135, with no horizontal component. This may allow for cleaner and more direct power and ground distribution to processor chip package 20 (and thus, processor die 15) than could otherwise be achieved by distributing power and ground horizontally through power and ground planes in motherboard 50.

Interposer 101 has a relatively low thermal mass, such that it is suitable for soldering to the PCB that is motherboard 50. In contrast, DC-DC converter 105 has a relatively large thermal mass that makes it unsuitable for soldering. Thus, while interposer 101 is coupled to motherboard 50 by soldering, DC-DC converter 105 in this embodiment is mechanically coupled to the interposer 101 without soldering or other means requiring heat (embodiments wherein the attachment requires some localized heating are also possible and contemplated). This coupling of DC-DC converter 105 to interposer 101 may take place subsequent to the soldering operations wherein interposer 101 is attached to motherboard 50. Although not shown in FIG. 1, interposer 101 includes a socket that is configured to receive a plurality of electromechanical connecting members of DC-DC converter 105. This arrangement will be discussed in further detail below.

The coupling of voltage regulator 100 (including both portions) to motherboard 50 may be secured by fasteners 111. In this embodiment, fasteners 111 are threaded fasteners (e.g., bolts) that extend through the housing of DC-DC converter 105, through interposer 101, through motherboard 50, and to heat sink 25. This is but one of many possible arrangements for using fasteners to secure voltage regulator 100 to motherboard 50, and other arrangements may be used per specific design requirements.

The arrangement of electronic assembly 10 shown in FIG. 1 allows a voltage regulator configured to sourcing and sinking (through ground) a large amount of current to be assembled in direct contact with the motherboard upon which a processor (or other integrated circuit) is mounted. This may allow more efficient power delivery to one or more integrated circuits in the chip package that have high current requirements (e.g., 300 amperes in one example). Instead of attempting to solder a high-current voltage regulator directly to a PCB (which may be difficult, if not impossible), or distribute power from a remote voltage regulator, the configuration enables the high-current voltage regulator to be placed as close as possible to the consumer of its power, with minimal impact on the design of the PCB, while also minimizing the amount of inductive impedance introduced into the power distribution system. Power distribution and signal routing in motherboard 50 may be simplified by such an arrangement. Furthermore, the arrangement may allow for a greater volumetric density of high-current demanding devices on the PCB.

Figure 2:
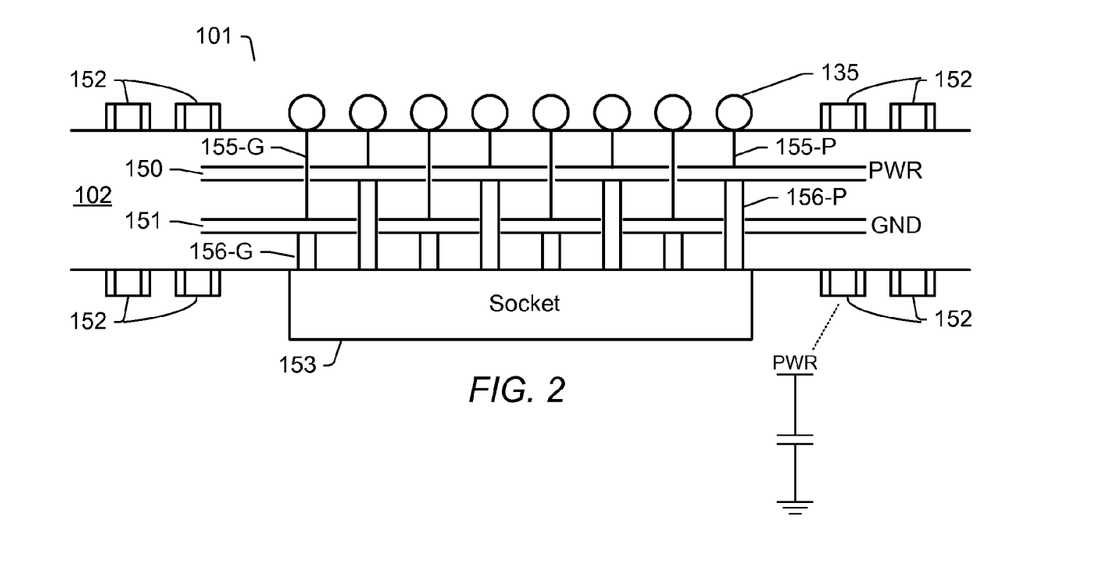
FIG. 2 is a drawing of one embodiment of an interposer structure comprising the first portion of the voltage regulator shown in FIG. 1.

Turning now to FIG. 2, a drawing of one embodiment of an interposer structure comprising the first portion of the voltage regulator shown in FIG. 1 is shown. Interposer 101 includes the plurality of solder balls as discussed above, on a first side, and a socket 153 mounted externally on a second side of a laminate structure 102. Embodiments are also possible and contemplated wherein socket 153 is integral to laminate structure 102. Socket 153 is configured for receiving connecting members of a corresponding DC-DC converter, such as that discussed above with respect to FIG. 1.

Laminate structure 102 includes at least one power plane 150 and one ground plane 151 in the embodiment shown. Embodiments having a plurality of power and ground planes are possible and contemplated. Power plane 150 is electrically coupled to various ones of solder balls 135 by electrical connections 155-P. Similarly, ground plane 151 is electrically coupled to other ones of solder balls 135 by electrical connections 155-G. Power plane 150 is also electrically coupled to corresponding receptacles in socket 153 by electrical connections 156-P. Ground plane 151 is electrically coupled to corresponding receptacles in socket 153 by electrical connections 156-G. Laminate structure 102 may also include additional layers, such as dielectric layers as well as surface layers. In general, laminate structure 102 may be any type of laminate structure having various layers including at least one ground plane and at least one power plane.

Interposer 101 includes a plurality of decoupling capacitors 152 mounted on laminate structure 102. The decoupling capacitors in the embodiment shown are surface-mounted capacitors, although capacitors coupled using pins soldered into plated through holes may also be used in other embodiments. Decoupling capacitors 152 are each electrically coupled between power and ground (i.e. between the power and ground planes), and provide a low impedance path to shunt power plane noise to ground.

Figure 3A:
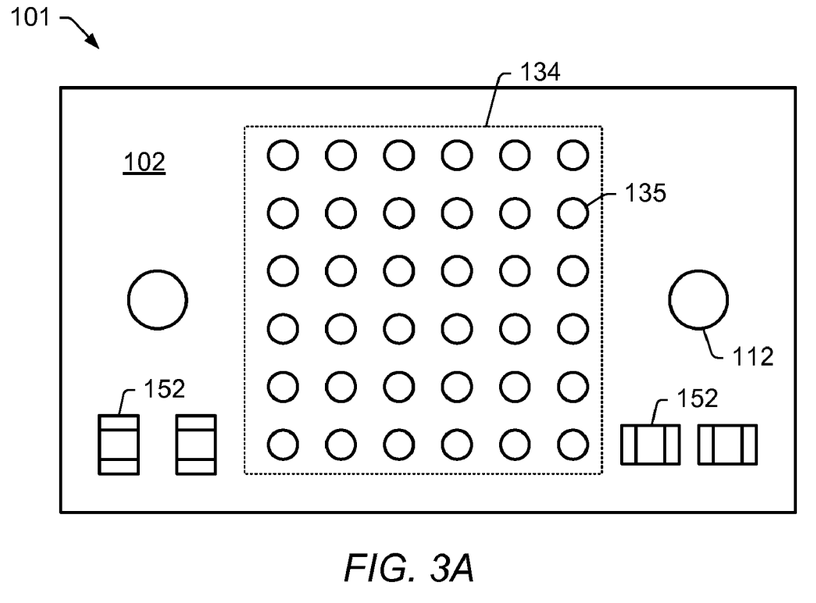
FIG. 3A and FIG. 3B are drawings of one embodiment of the interposer showing a top view and a bottom view, respectively.
Figure 3B:
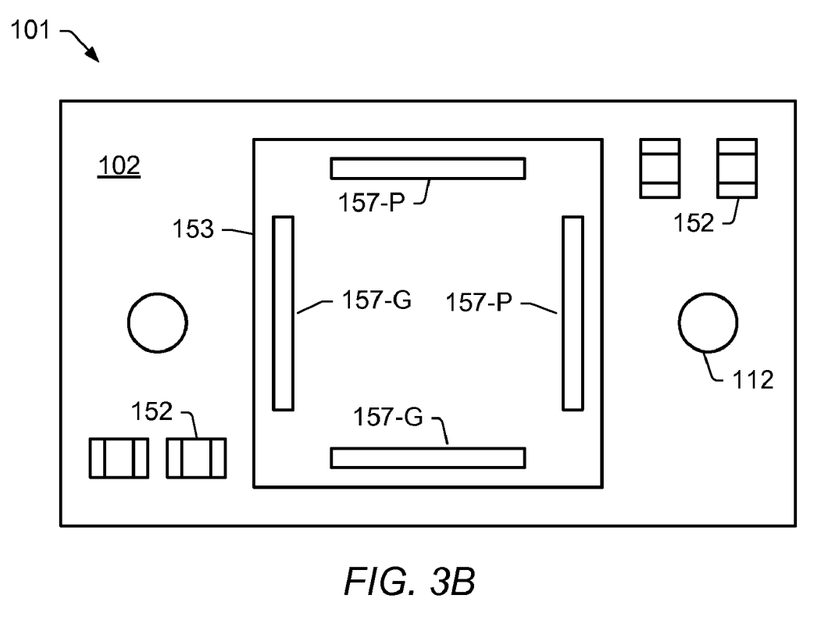

FIG. 3A and FIG. 3B are drawings of one embodiment of the interposer 101 showing a top view and a bottom view, respectively. In the top view of FIG. 3A, interposer 101 includes the laminate structure 102, which has a plurality of solder balls 135 thereon that are arranged to form a BGA footprint 134. In coupling interposer 101 to motherboard 50, each of the solder balls may be temporarily melted to form a solder connection with corresponding BGA surface pads on motherboard 50. As previously noted, other embodiments may utilize other types of electrical connections suitable for coupling laminate structure 102 of interposer 101 to a PCB such as motherboard 50.

A plurality of decoupling capacitors 152 are also mounted on the top side of laminate structure 102. In this particular example, decoupling capacitors 152 are surface mount capacitors, although embodiments utilizing non-surface mount capacitors are also possible and contemplated.

Holes 112 are also present in laminate structure 102 to allow for the passage of fasteners 111. In some embodiments, holes 112 may be threaded. The number of holes 112 may vary from one embodiment to the next, depending on the number of fasteners to be used. Embodiments having no holes 112 (and thus not having fasteners passing through) are also possible and contemplated.

In FIG. 3B, interposer 101 includes socket 153 mounted to the bottom side of laminate structure 102. Socket 153 in this particular arrangement includes two receptacles 157-P for receiving corresponding connecting members of DC-DC converter 105, through which power is provided. Receptacles 157-P are electrically coupled to power plane 150. Receptacles 157-G are also configured to receive corresponding connecting members of the DC-DC converter, and provide an electrical connection to ground plane 151.

As shown in FIG. 3B, interposer 101 may include additional decoupling capacitors 152 that are surface mounted on the bottom side of laminate structure 102. As previously noted, embodiments utilizing non-surface mount capacitors are also possible and contemplated.

Figure 4A:
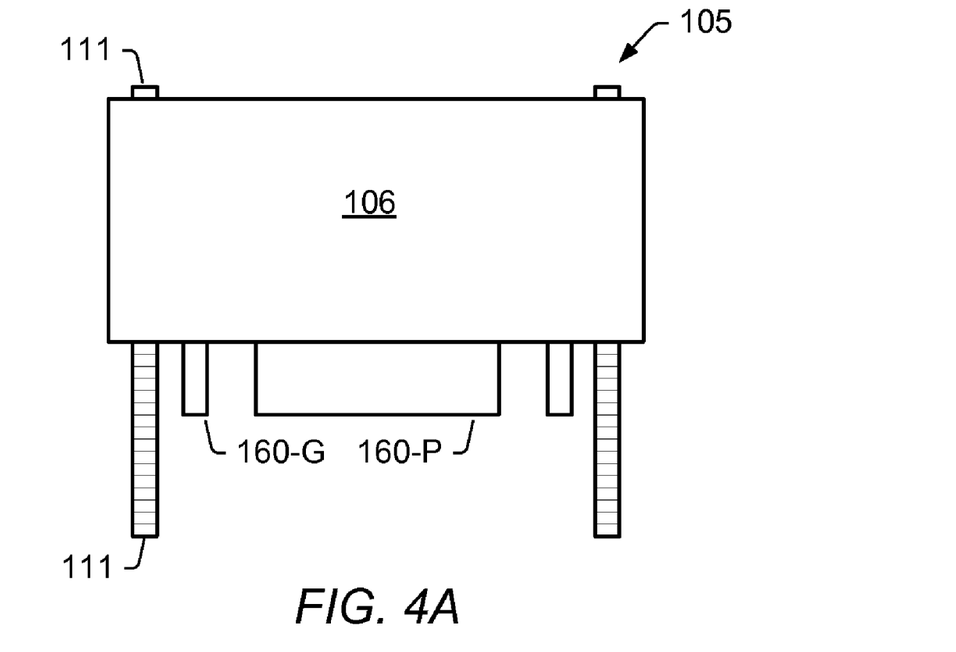
FIG. 4A and FIG. 4B are drawings of one embodiment of a DC-DC converter of the voltage regulator shown in FIG. 1 showing side and bottom views, respectively.
Figure 4B:
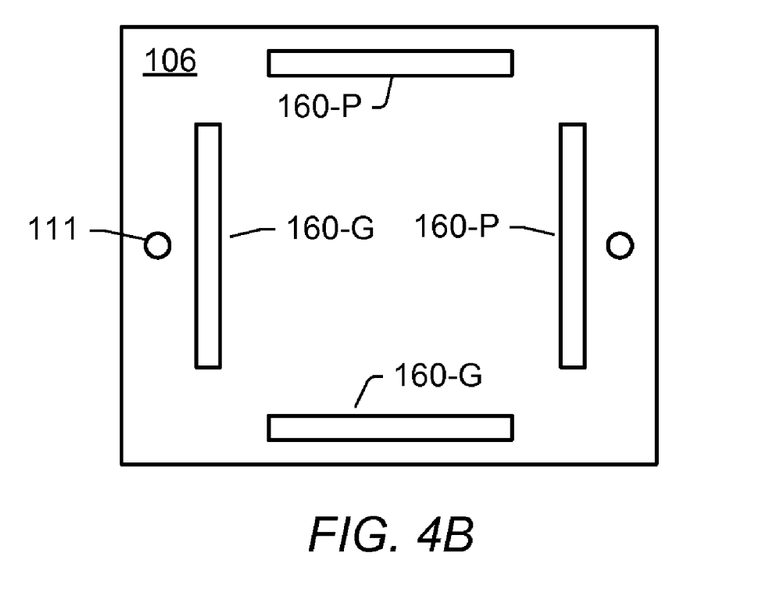

FIG. 4A and FIG. 4B are drawings of one embodiment of a DC-DC converter of the voltage regulator 100 of FIG. 1 showing side and bottom views, respectively. As shown in FIG. 4A, DC-DC converter 105 includes a housing 106. The various electrical components of the DC-DC converter 105 are contained within housing 106.

DC-DC converter 105 also include electromechanical connecting members 160-P and 160-G. These electromechanical connecting members are configured for insertion into corresponding receptacles of socket 153, and provide both an electrical and a mechanical connection between DC-DC converter 105 and interposer 101. With respect to the electrical connections, connecting members 160-P provide electrical connection through which power is conveyed to interposer 101, and eventually, to an integrated circuit coupled to the other side of a PCB. Connecting members 160-G provide a corresponding return path in the form of a ground connection.

In the embodiment shown, the mechanical connection formed using electro-mechanical connecting members 160-P and 160-G is one such that DC-DC converter 105 is detachable from interposer 101 without any de-soldering or other process that requires heat. In some cases, fasteners (such as fasteners 111 shown extending through housing 106) may need to be removed, but otherwise no additional operations need to be performed. Thus, DC-DC converter 105 may be quickly attachable to and detachable from interposer 101. However, it should be noted that embodiments are also possible and contemplated wherein the attachment of the DC-DC converter is more permanent than that explicitly described herein.

FIG. 4B illustrates a bottom view of DC-DC converter 105. Electro-mechanical connecting members 160-P and 160-G are arranged in such a manner as to correspond to the receptacles of socket 153 of interposer 101. DC-DC converter may be initially coupled to interposer 101 by inserting the electro-mechanical connecting members into their corresponding receptacles of socket 153.

It should be noted that connecting members in other arrangements may also be used in various embodiments. For example, another embodiment could use pins arranged in a pin-grid array, with a socket on an interposer having corresponding receptacles for receiving the pins. In general, any arrangement that is suitable to the particular application may be used. Furthermore, in some embodiments, the group of connecting members may include one or more that enable a connection to be made only in the correct orientation. This may prevent coupling of power connections to a ground plane, and vice versa.

Figure 4C:
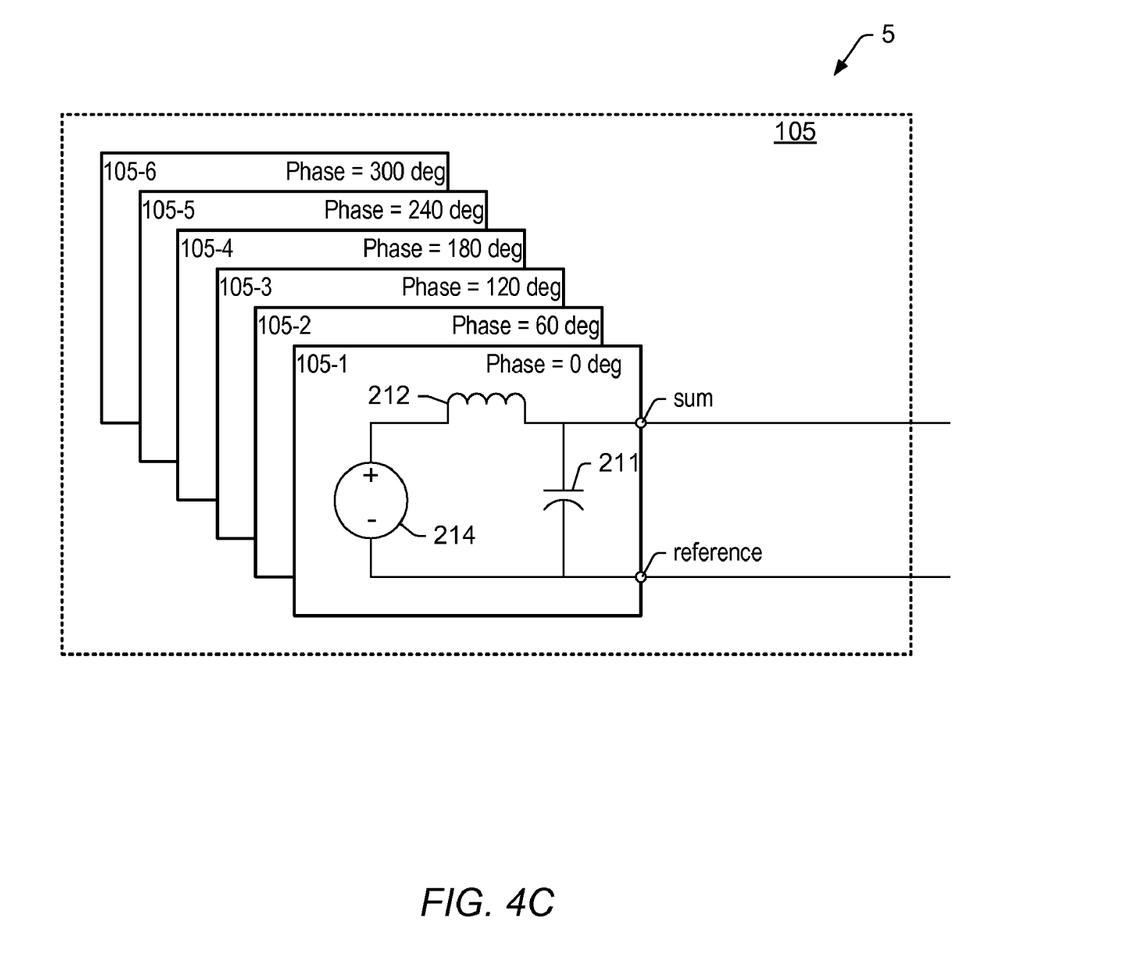
FIG. 4C is another drawing of one embodiment of the DC-DC converter in a schematic representation.

FIG. 4C is another drawing of one embodiment of the DC-DC converter 105 in a schematic representation. In this embodiment, DC-DC converter 105 is a multiphase DC-DC converter. A multiphase DC-DC converter includes a plurality of square wave generators 214 (one for each phase), wherein the output of each of the square wave generators provides a portion of the DC output. In this particular example, VRM 10 is a six-phase DC-DC converter. A first phase 105-1 provides the DC output from 0 to 60 degrees, a second phase 105-2 provides the DC output from 60 to 120 degrees, and so forth. Such multiphase DC-DC converters are commonly used in high-current, low voltage applications, as the stress on individual components is distributed among the phases instead of being concentrated in a single phase. An external power source (not shown) may be coupled to DC-DC converter 105 in order to supply power.

Embodiments are also possible and contemplated wherein multiple DC-DC converters 105 may be used, each separately attached to the interposer. Such an embodiment may allow separation of the phases provided by each of the multiple DC-DC converters. For example, a first DC-DC converter could provide phases 1, 3, and 5 (of a total of 6 phases), while a second DC-DC converter could provide phases 2, 4, and 6.

Each square wave generator 214 of DC-DC converter 105 is coupled between a sum node and a reference node. More particularly, the sum node is that node where the DC output voltage is present during operation of DC-DC converter 105, while the reference node is a node to which the DC output voltage is referenced to (e.g., the ground node). The sum node is electrically coupled to each of the one or more electro-mechanical connecting members 160-P. The reference node is electrically coupled to each of the one or more electromechanical connecting members 160-G.

A working inductor 212 is coupled between the positive output of each square wave generator 214 and the sum node. A first capacitance may be coupled between the sum node and the reference node. The first capacitance may be implemented using one or more capacitors 211 mounted to one or more circuit boards that provide the phases 105-1 to 105-6.

It should be noted that the DC-DC converter 105 discussed in reference to FIG. 4C is exemplary, and other types of DC-DC converters may also be used. For example, while the DC-DC converter 105 disclosed herein is a multi-phase DC- DC converter, other embodiments utilizing a single-phase DC-DC converter are also contemplated.

Figure 5:
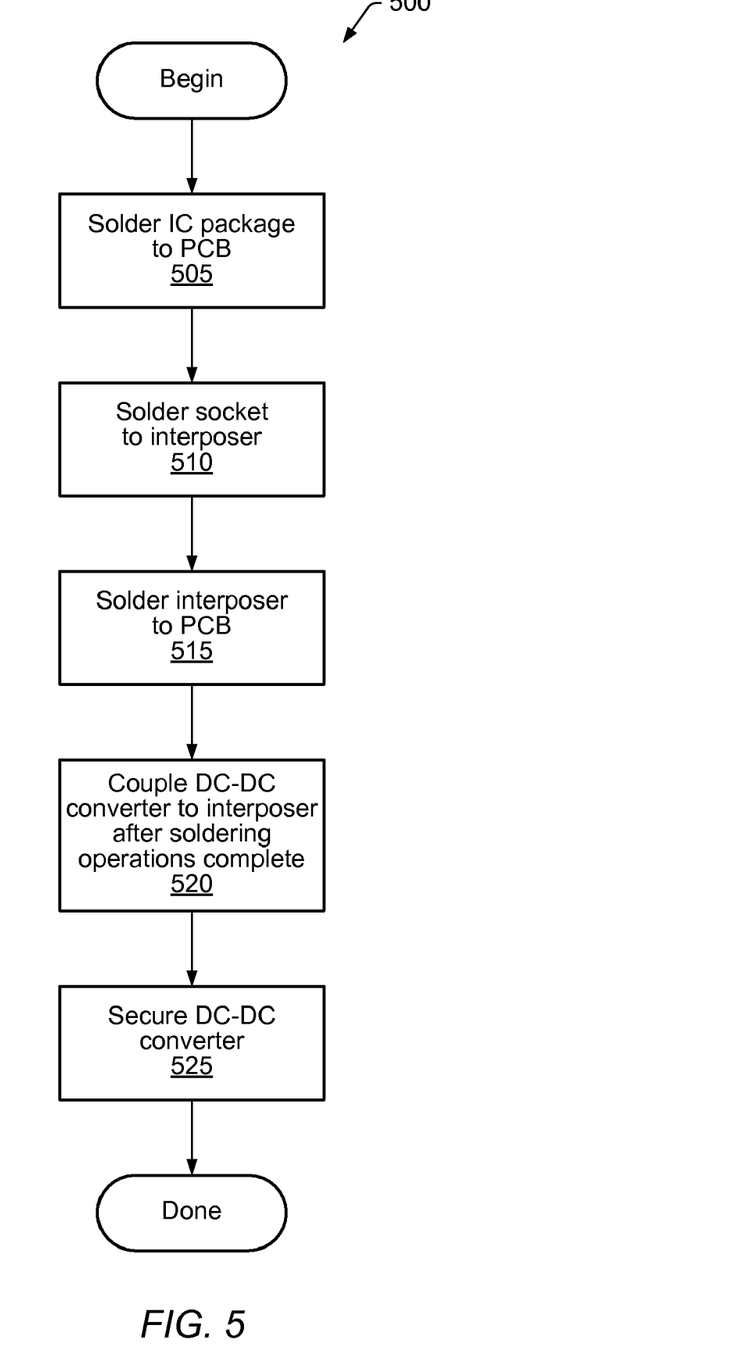
FIG. 5 is a flow diagram of one embodiment of a method for assembling the electronic structure of FIG. 1.

FIG. 5 is a flow diagram of one embodiment of a method for assembling the electronic assembly of FIG. 1. Method 500 begins with the soldering of an integrated circuit (IC) package to a PCB (505). A socket may be soldered to an interposer (510), wherein the interposer is a first component of a voltage regulator assembly. Operation 510 may be skipped if the socket is integral to a laminate structure of the interposer. The first component of a voltage regulator assembly may also be soldered to the PCB in a location opposite of the IC package (515). As used herein, the term "opposite" can be considered to be on the other side of the PCB in a position that is approximately the same lateral position of the IC package. It is also noted that the soldering operations for the IC package, the socket, and the interposer (to the PCB) may be performed concurrently.

Subsequent to soldering the interposer to the PCB, a second component of the voltage regulator, a DC-DC converter may be coupled to the interposer (via the socket, in embodiments so arranged) (520). Since the DC-DC converter has a thermal mass that makes it unsuitable for soldering, it is electro-mechanically coupled to the interposer without soldering. Following the coupling of the DC-DC converter to the interposer, it may be secured to the electronic assembly (525) using fasteners (e.g., such as fasteners 111 as discussed above).

It should be noted that while the examples presented above have been directed to a system having a processor coupled to a motherboard, the disclosure is not so limited. In general, the disclosure presented herein may apply to any electronic system having one or more integrated circuits that consume a large amount of current mounted on a PCB, and in turn, requires a power source having the capability to deliver the required current.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A voltage regulator comprising:
an interposer including:
a plurality of electrical connections suitable for coupling to a printed circuit board (PCB) on a first side of the interposer; and
a power plane and a ground plane, wherein the power plane is electrically coupled to at least one of the electrical connections and wherein the ground plane is electrically coupled to at least one other of the plurality of electrical connections; and
a DC-DC converter, wherein the DC-DC converter is electro-mechanically attachable to and detachable from the interposer, wherein the interposer includes, on a second side, a socket configured to receive two or more electromechanical connecting members of the DC-DC converter;
wherein at least one of the electromechanical connecting members is electrically coupled to the power plane and at least one other one of the electro-mechanical connecting members is electrically coupled to the ground plane when the DC-DC converter is attached to the interposer.

2. The voltage regulator as recited in claim 1, wherein the electrical connections are solder balls forming a ball-grid array (BGA).

3. The voltage regulator as recited in claim 1, wherein the electrical connections are pads forming a land-grid array (LGA), and wherein the pads are coupled to corresponding pads of the PCB by one of the following: elastomeric connectors, solder balls.

4. The voltage regulator as recited in claim 1, wherein the electrical connectors are pins forming a pin-grid array (PGA).

5. The voltage regulator as recited in claim 1, wherein the DC-DC converter is a multi-phase DC-DC converter.

6. The voltage regulator as recited in claim 1, wherein the interposer includes a plurality of decoupling capacitors mounted thereupon.

7. The voltage regulator as recited in claim 1, wherein the DC-DC converter includes a first fastener and a second fastener each suitable for securing the voltage regulator to the PCB.

8. The voltage regulator as recited in claim 1, wherein a thermal mass of the interposer is less than a thermal mass of the DC-DC converter, wherein the thermal mass of the interposer is such that the interposer is suitable for soldering to the PCB while the thermal mass of the DC-DC converter is such that it is not suitable for soldering to the PCB.

9. An electronic assembly comprising:
a printed circuit board (PCB);
an integrated circuit (IC) package mounted to a first footprint on a first side of the PCB; and
a voltage regulator coupled to a second side of the PCB and configured to provide power to an IC in the IC package, wherein the voltage regulator includes:
an interposer having a plurality of electrical connections mounted to a footprint on the second side of the PCB in a location opposite of the IC package;
a power plane and a ground plane, wherein the power plane is electrically coupled to at least one of the electrical connections, and wherein the ground plane is electrically coupled to at least one other of the plurality of electrical connections; and
a DC-DC converter coupled to the interposer, wherein the DC-DC converter is electro-mechanically attachable to and detachable from the interposer, wherein the interposer includes a socket configured to receive two or more electromechanical connecting members of the DC-DC converter;
wherein at least one of the electromechanical connecting members is electrically coupled to the power plane and at least one other one of the electromechanical connecting members is electrically coupled to the ground plane when the DC-DC converter is attached to the interposer.

10. The electronic assembly as recited in claim 9, wherein the IC package is mounted to the PCB by solder balls forming a first ball-grid array (BGA) and the interposer is mounted to the PCB by solder balls forming a second BGA.

11. The electronic assembly as recited in claim 10, wherein the PCB includes a plurality of vertical vias extending through a thickness thereof, wherein each of the vertical vias electrically couples one of the solder balls of the first BGA to one of the solder balls of the second BGA, and wherein each of the vertical vias provides one of a power connection or a ground connection between the interposer and the IC package.

12. The electronic assembly as recited in claim 9, wherein a thermal mass of the interposer is less than a thermal mass of the DC-DC converter, wherein the thermal mass of the interposer is such that the interposer is suitable for soldering to the PCB while the thermal mass of the DC-DC converter is such that it is not suitable for soldering to the PCB.

13. The electronic assembly as recited in claim 9, further comprising at least a first fastener and a second fastener securing the DC-DC converter to the PCB.

14. The electronic assembly as recited in claim 13, wherein the electronic assembly further includes a heat sink coupled to the IC package, and wherein the first fastener and second fastener extend through the PCB and are coupled to the heat sink.

15. The electronic assembly as recited in claim 9, wherein the interposer includes a plurality of decoupling capacitors mounted thereon.

16. The electronic assembly as recited in claim 9, wherein the DC-DC converter is a multi-phase DC-DC converter.

17. The electronic assembly as recited in claim 9, wherein the socket is mounted upon the interposer.

18. A method for assembling and electronic apparatus, the method comprising:
   soldering an integrated circuit (IC) package to a first side of a printed circuit board (PCB);
   coupling a voltage regulator to a second side of the PCB, wherein said coupling includes:
      soldering an interposer to the second side of the PCB in a location opposite of the IC package; and
      coupling a DC-DC converter to the interposer, wherein the interposer includes a socket configured to receive two or more electro-mechanical connecting members of the DC-DC converter, and
      wherein the DC-DC converter is electro-mechanically attachable to and detachable from the interposer;
   wherein said soldering the IC package and said soldering the interposer are each performed prior to said coupling the DC-DC converter.

19. The method as recited in claim 18 further comprising soldering the socket to the interposer prior to said coupling the DC-DC converter.

20. The method as recited in claim 18 further comprising securing the DC-DC converter in place using a first fastener and a second fastener coupled to the DC-DC converter and the PCB.

* * * * *